United States Patent
He et al.

(10) Patent No.: US 11,507,156 B2
(45) Date of Patent: Nov. 22, 2022

(54) COOLING SYSTEM WITH HYPERBARIC FAN AND EVACUATIVE FAN

(71) Applicant: Dell Products L.P., Round Rock, TX (US)

(72) Inventors: Qinghong He, Austin, TX (US); Travis Christian North, Cedar Park, TX (US); Allen B. McKittrick, Cedar Park, TX (US)

(73) Assignee: Dell Products L.P., Round Rock, TX (US)

( * ) Notice: Subject to any disclaimer, the term of this patent is extended or adjusted under 35 U.S.C. 154(b) by 414 days.

(21) Appl. No.: 16/777,431

(22) Filed: Jan. 30, 2020

(65) Prior Publication Data

US 2021/0240239 A1    Aug. 5, 2021

(51) Int. Cl.
| | |
|---|---|
| *G06F 1/20* | (2006.01) |
| *H05K 7/20* | (2006.01) |
| *G06F 1/16* | (2006.01) |
| *H05K 9/00* | (2006.01) |

(52) U.S. Cl.
CPC ............ *G06F 1/206* (2013.01); *G06F 1/1656* (2013.01); *G06F 1/203* (2013.01); *H05K 7/20145* (2013.01); *H05K 7/20172* (2013.01); *H05K 7/20209* (2013.01); *H05K 9/0007* (2013.01); *G06F 2200/201* (2013.01)

(58) Field of Classification Search
CPC ........ G06F 1/203; G06F 1/206; G06F 1/1656; G06F 2200/201; H05K 7/20145; H05K 7/20172; H05K 7/20209
See application file for complete search history.

(56) References Cited

U.S. PATENT DOCUMENTS

| | | | | |
|---|---|---|---|---|
| 5,694,294 A | * | 12/1997 | Ohashi | G06F 1/203 361/679.48 |
| 5,828,034 A | * | 10/1998 | Chang | G06F 3/0202 219/209 |
| 6,255,622 B1 | * | 7/2001 | May | G06F 1/203 219/209 |
| 6,744,631 B1 | * | 6/2004 | Chuang | G06F 1/203 361/679.48 |
| 6,909,602 B2 | * | 6/2005 | Dietrich | G06F 1/1656 361/679.48 |
| 6,934,267 B1 | * | 8/2005 | Mannerstråle | H04W 72/0446 370/311 |
| 9,392,726 B2 | * | 7/2016 | Shelnutt | H05K 7/20727 |
| 9,743,552 B2 | * | 8/2017 | Ragupathi | H05K 7/20209 |

(Continued)

*Primary Examiner* — Adrian S Wilson
(74) *Attorney, Agent, or Firm* — McDermott Will & Emery LLP

(57) ABSTRACT

A system and method for cooling components and a chassis in a portable information handling system includes a pressure barrier that divides the chassis into a plurality of zones, an evacuative fan in a first zone to generate airflow across components to cool the components and a hyperbaric fan in a second zone to increase air pressure in the second zone. The pressure barrier may provide thermal isolation, acoustic dampening and electromagnetic insulation. A controller communicatively coupled to the fans can operate each fan independently to cool components for improved performance and maintain a surface temperature of the chassis below a temperature for user comfort.

18 Claims, 7 Drawing Sheets

(56) References Cited

U.S. PATENT DOCUMENTS

| | | | |
|---|---|---|---|
| 10,851,800 B2* | 12/2020 | He | F04D 29/424 |
| 2003/0161102 A1* | 8/2003 | Lee | G06F 1/203 |
| | | | 361/679.48 |
| 2005/0049729 A1* | 3/2005 | Culbert | G06F 1/324 |
| | | | 713/340 |
| 2005/0152112 A1* | 7/2005 | Holmes | G06F 1/206 |
| | | | 361/695 |
| 2005/0288886 A1* | 12/2005 | Therien | G06F 1/206 |
| | | | 702/130 |
| 2012/0069514 A1* | 3/2012 | Ross | G06F 1/20 |
| | | | 361/679.33 |
| 2012/0075992 A1* | 3/2012 | Shahidi | G06F 1/206 |
| | | | 370/252 |
| 2016/0095250 A1* | 3/2016 | Shelnutt | H05K 7/20209 |
| | | | 361/679.49 |
| 2017/0079160 A1* | 3/2017 | Ragupathi | H05K 7/20209 |
| 2019/0069441 A1* | 2/2019 | Khachaturov | H05K 7/20909 |

* cited by examiner

COOLING SYSTEM WITH HYPERBARIC FAN AND EVACUATIVE FAN

BACKGROUND

Field of the Disclosure

This disclosure relates generally to information handling systems and, more particularly, to systems and methods for cooling components and the chassis in portable information handling systems.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Examples of information handling systems include portable devices such as notebook computers, media players, tablet computers and 2-in-1 tablet-laptop combination computers. A portable device may generally be any device that a user may carry for handheld use and that includes a processor. Typically, portable devices have the same functionality as desktop information handling systems but are configured to be compact, lightweight and may operate on battery power.

SUMMARY

A chassis for a portable information handling system is designed to be compact and lightweight and may generally refer to any enclosure for information handling system that a user may carry for handheld use. Various chassis contain information handling systems intended for use in various environments and configured to provide the functionality of other information handling systems.

In one aspect, a disclosed cooling system for a chassis of a portable information handling system includes a pressure barrier formed to divide the chassis into a plurality of zones, a first fan configured for cooling components of the information handling system in the first zone and a second fan in the second zone for cooling the chassis. Instructions are executable by a processor to operate each fan independently and the pressure barrier ensures airflows remain separate in order to maintain component operating temperatures below a first temperature, maintain a surface temperature of the chassis below a second temperature, and may increase component performance and extend battery life of the portable information handling system.

BRIEF DESCRIPTION OF THE DRAWINGS

For a more complete understanding of the present invention and its features and advantages, reference is now made to the following description, taken in conjunction with the accompanying drawings, in which.

DESCRIPTION OF PARTICULAR EMBODIMENT(S)

Figure 1:
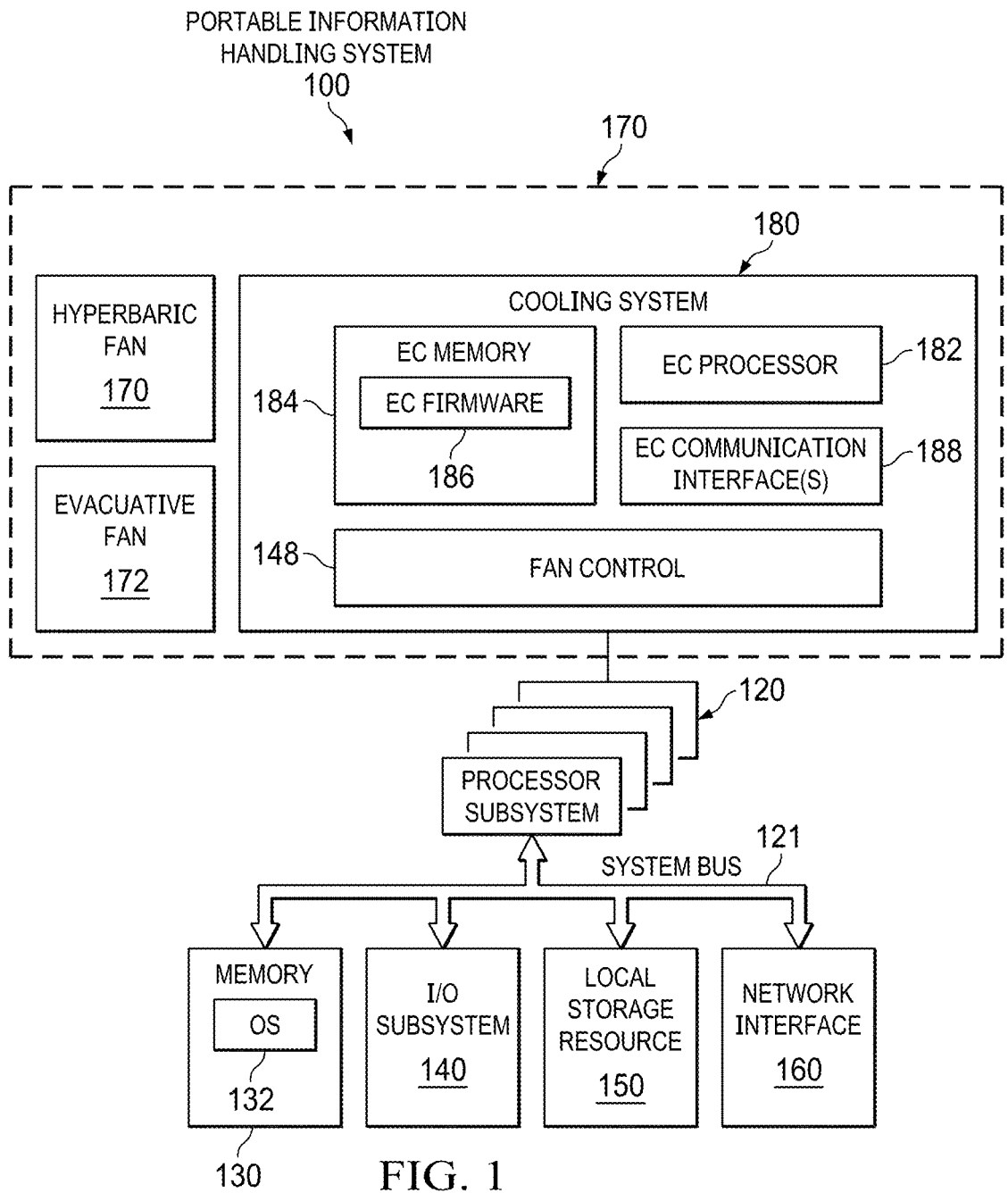
FIG. 1 is a block diagram of selected elements of an embodiment of a portable information handling system.

In the following description, details are set forth by way of example to facilitate discussion of the disclosed subject matter. It should be apparent to a person of ordinary skill in the field, however, that the disclosed embodiments are exemplary and not exhaustive of all possible embodiments.

As used herein, a hyphenated form of a reference numeral refers to a specific instance of an element and the un-hyphenated form of the reference numeral refers to the collective or generic element. Thus, for example, widget "72-1" refers to an instance of a widget class, which may be referred to collectively as widgets "72" and any one of which may be referred to generically as a widget "72."

For the purposes of this disclosure, an information handling system may include an instrumentality or aggregate of instrumentalities operable to compute, classify, process, transmit, receive, retrieve, originate, switch, store, display, manifest, detect, record, reproduce, handle, or utilize various forms of information, intelligence, or data for business, scientific, control, entertainment, or other purposes. For example, an information handling system may be a personal computer, a consumer electronic device, a network storage device, or another suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and one or more video displays. The information handling system may also include one or more buses operable to transmit communication between the various hardware components.

For the purposes of this disclosure, computer-readable media may include an instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory (SSD); as well as communications media such wires, optical fibers, microwaves, radio waves, and other electromagnetic and/or optical carriers; and/or any combination of the foregoing.

Particular embodiments are best understood by reference to FIGS. 1-7 wherein like numbers are used to indicate like and corresponding parts.

Turning to the drawings, FIG. 1 illustrates a block diagram depicting selected elements of an embodiment of portable information handling system 100. It is noted that FIG. 1 is not drawn to scale but is a schematic illustration. In various embodiments, portable information handling system 100 may represent different types of portable devices.

As shown in FIG. 1, components of portable information handling system 100 may include, but are not limited to, a processor subsystem 120, which may comprise one or more processors, and a system bus 121 that communicatively couples various system components to processor subsystem 120 including, for example, a memory 130, an I/O subsystem 140, local storage resource 150, and a network interface 160. Also shown within portable information handling system 100 are embedded controller (EC) 180 coupled to hyperbaric fan 170 and evacuative fan 172 for managing the temperatures of components in portable information handling system 100 and the temperature of an exterior surface of a chassis containing portable information handling system 100, as discussed below in greater detail.

Processor subsystem 120 may comprise a system, device, or apparatus operable to interpret and execute program instructions and process data, and may include a microprocessor, microcontroller, digital signal processor (DSP), application specific integrated circuit (ASIC), or another digital or analog circuitry configured to interpret and execute program instructions and process data. In some embodiments, processor subsystem 120 may interpret and execute program instructions and process data stored locally (e.g., in memory 130). In the same or alternative embodiments, processor subsystem 120 may interpret and execute program instructions and process data stored remotely (e.g., in a network storage resource).

System bus 121 may represent a variety of suitable types of bus structures, e.g., a memory bus, a peripheral bus, or a local bus using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express bus, HyperTransport (HT) bus, and Video Electronics Standards Association (VESA) local bus.

Memory 130 may comprise a system, device, or apparatus operable to retain and retrieve program instructions and data for a period of time (e.g., computer-readable media). Memory 130 may comprise random access memory (RAM), electrically erasable programmable read-only memory (EEPROM), a PCMCIA card, flash memory, magnetic storage, opto-magnetic storage or a suitable selection or array of volatile or non-volatile memory that retains data after power is removed. In FIG. 1, memory 130 is shown including an operating system (OS) 132, which may represent an execution environment for portable information handling system 100. Operating system 132 may be UNIX or be based on UNIX (e.g., a LINUX variant), one of a number of variants of Microsoft Windows® operating systems, an Apple® MacOS operating system, an embedded operating system, a gaming operating system, or another suitable operating system.

Local storage resource 150 may comprise computer-readable media (e.g., hard disk drive, floppy disk drive, CD-ROM, and other type of rotating storage media, flash memory, EEPROM, or another type of solid state storage media) and may be generally operable to store instructions and data, and to permit access to stored instructions and data on demand.

Network interface 160 may be a suitable system, apparatus, or device operable to serve as an interface between portable information handling system 100 and a network (not shown). Network interface 160 may enable portable information handling system 100 to communicate over the network using a suitable transmission protocol or standard. In some embodiments, network interface 160 may be communicatively coupled via the network to a network storage resource (not shown). The network coupled to network interface 160 may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, the Internet or another appropriate architecture or system that facilitates the communication of signals, data and messages (generally referred to as data). The network coupled to network interface 160 may transmit data using a desired storage or communication protocol, including, but not limited to, Fibre Channel, Frame Relay, Asynchronous Transfer Mode (ATM), Internet protocol (IP), other packet-based protocol, small computer system interface (SCSI), Internet SCSI (iSCSI), Serial Attached SCSI (SAS) or another transport that operates with the SCSI protocol, advanced technology attachment (ATA), serial ATA (SATA), advanced technology attachment packet interface (ATAPI), serial storage architecture (SSA), integrated drive electronics (IDE), or any combination thereof. The network coupled to network interface 160 or various components associated therewith may be implemented using hardware, software, or any combination thereof.

In portable information handling system 100, I/O subsystem 140 may comprise a system, device, or apparatus generally operable to receive and transmit data to or from or within portable information handling system 100. I/O subsystem 140 may represent, for example, a variety of communication interfaces, graphics interfaces, video interfaces, user input interfaces, and peripheral interfaces. In various embodiments, I/O subsystem 140 may be used to support various peripheral devices, such as a touch panel, a display adapter, a keyboard, an accelerometer, a touch pad, a gyroscope, or a camera, among other examples. In some implementations, I/O subsystem 140 may support so-called 'plug and play' connectivity to external devices, in which the external devices may be added or removed while portable information handling system 100 is operating.

Also shown in FIG. 1 is cooling system 190, which includes embedded controller (EC) 180, hyperbaric fan 170 and one or more evacuative fan(s) 172. EC 180 may include EC processor 182 as a second processor included within portable information handling system 100 for certain management tasks, including supporting communication and providing various functionality for cooling portable information handling system 100. Thus, EC processor 182 may have access to EC memory 184, which may store EC firmware 186, representing instructions executable by EC processor 182 for managing operation of hyperbaric fan 170 and one or more evacuative fan(s) 172. Embedded controller 180 may execute EC firmware 186 on EC processor 182 even when other components in portable information handling system 100 are inoperable or are powered down. Furthermore, EC firmware 186 may be in control of EC communication interface(s) 188, which may represent one or more input/output interfaces or signals that embedded controller 180 can use to communicate with other elements of portable information handling system 100, such as processor subsystem 120 or I/O subsystem 140, among others.

Hyperbaric fan 170 may refer to any fan configured for increasing air pressure as a strategy for cooling. For example, hyperbaric fan 170 may increase static air pressure to cause air to move into restricted areas. In some embodiments, hyperbaric fan 170 may comprise a dual opposed outlet fan. Hyperbaric fan 170 increases air pressure in a particular zone to cause air movement to one or more openings in the zone.

Evacuative fan 172 may refer to any fan configured to generate an airflow. Evacuative fans 172 are typically used to cool components of processor subsystem 120 such as central processing units (CPU) and graphics processing units (GPU), which may generate significant heat due to processing performance. Evacuative fan 172 generates an airflow relative to one or more components of an information handling system in a particular zone to an opening in the zone and decreases air pressure in the zone.

Within embedded controller 180 is fan control 148, which may be responsible for managing operation of hyperbaric fan 170 and evacuative fan 172 to manage the cooling of portable information handling system 100. Fan control 148 may communicate with EC memory 184 storing values for a temperature for starting operation of hyperbaric fan 170 or evacuative fan 172, a fan speed and duration for cooling, and a temperature or time for stopping each of hyperbaric fan 170 and evacuative fan 172. The stored values may include a maximum component operating temperature and a maximum surface temperature, for example. In some embodiments, at least certain portions of fan control 148 may be implemented using EC firmware 186, such as specialized executable instructions for independently starting, operating and stopping hyperbaric fan 170 and evacuative fan 172 based on the values stored in EC memory 184. Embedded controller 180 may operate each of evacuative fans 172 and hyperbaric fans 170 independently.

Figure 2:
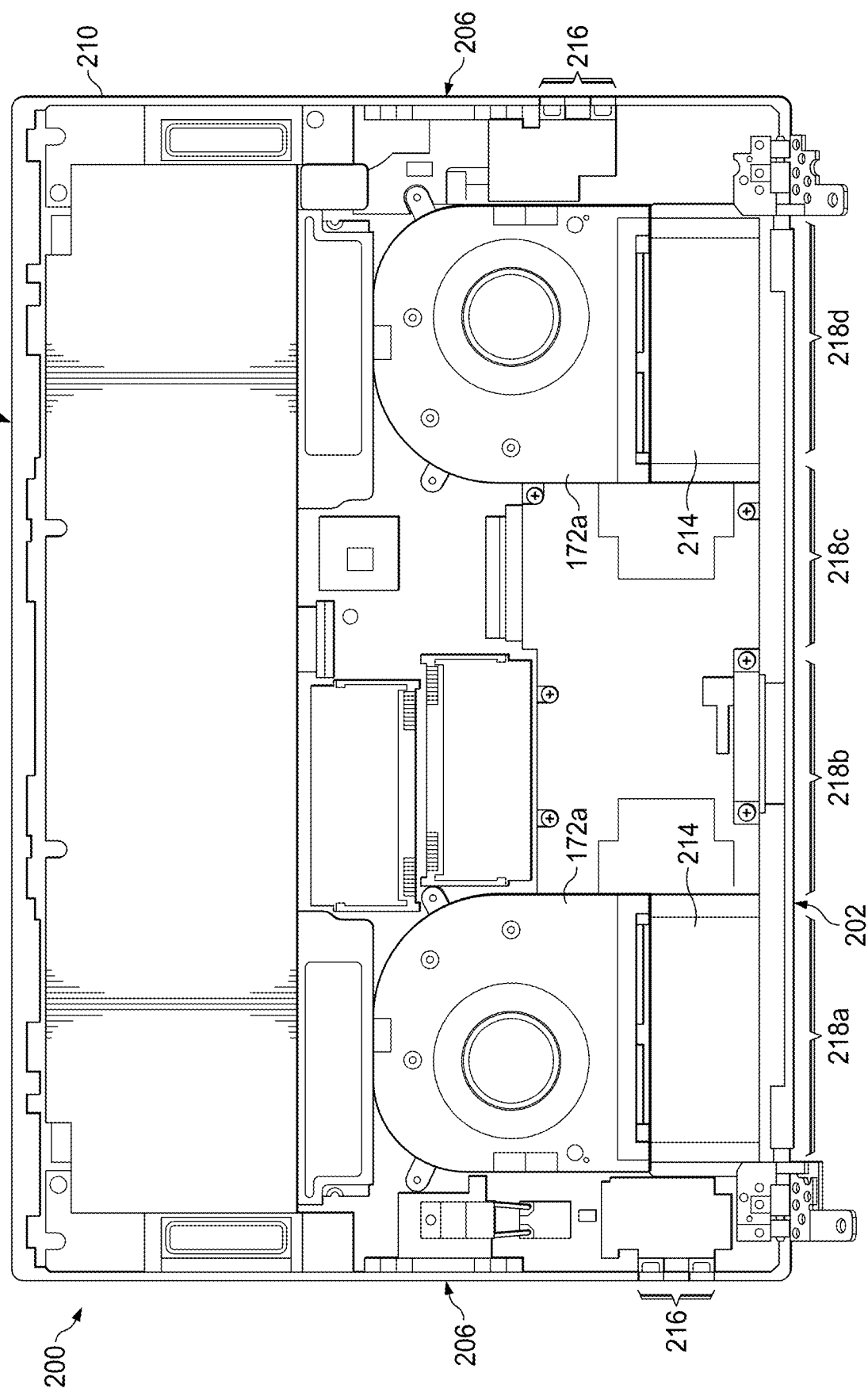
FIG. 2 is a top view of an exemplary chassis for an information handling system with cooling system utilizing two evacuative fans.
Figure 3:
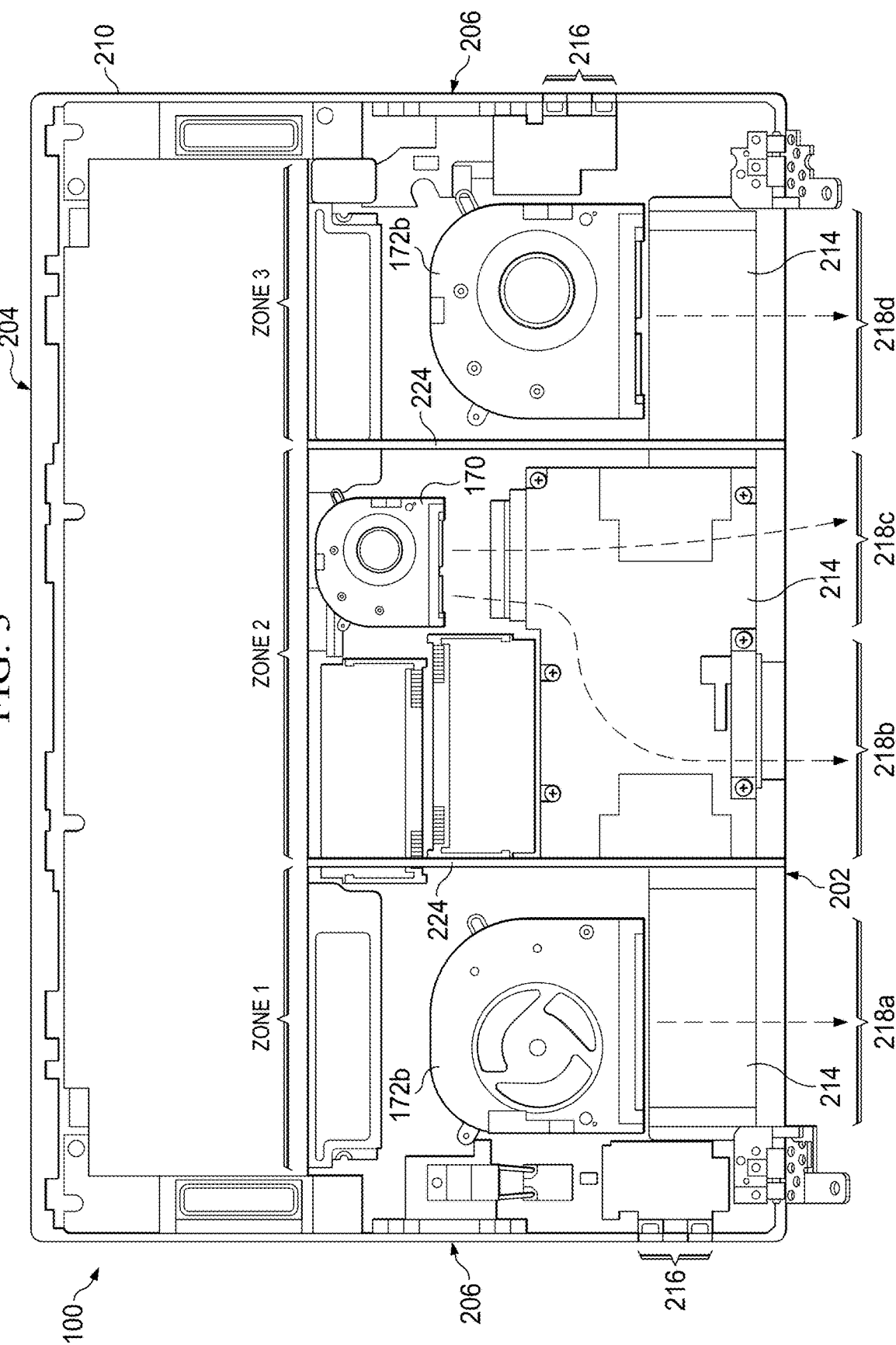
FIG. 3 is a top view of an exemplary chassis for an information handling system with an embodiment of a cooling system utilizing a pressure barrier to divide the chassis into multiple zones, with an evacuative fan in each of two zones and a hyperbaric fan in a third zone.

Portable information handling systems 100 may include laptop computers, notebook computers, netbook computers, tablet computers, and 2-in-1 tablet laptop combination computers, among others. Referring to FIGS. 2 and 3, embodiments of portable information handling system 100 may be assembled in chassis 200 and configured for use as various portable devices.

As depicted in FIGS. 2 and 3, chassis 200 comprises back panel 202 and front panel 204 defining a width of chassis 200 and side panels 206 defining a length of chassis 200. Back panel 202 comprises openings 218 generally configured to facilitate air entering and exiting chassis 200. Side panels 206 comprise openings 216 associated with USB ports, HDMI ports, cable attachment points or other I/O components such that air may enter and exit chassis 200. Back panel 202, front panel 204 and side panels 206 define a depth of chassis 200 between a bottom cover (not visible in FIG. 2 or 3) and a user surface (not shown). Within chassis 200, components of processor subsystem 120, memory 130, I/O subsystem 140, local storage resource 150, network interface 160 and cooling system 190 may be positioned to allow for a more compact design.

Cooling a portable device involves cooling components of portable information handling system 100 and cooling chassis 200.

Certain components of portable information handling system 100, particularly components (e.g., CPUs and GPUs) of processor subsystem 120, can generate heat at a rate that can cause the component operating temperature ($T_{JUNCTION}$) to exceed a maximum operating temperature. If the component operating temperature ($T_{JUNCTION}$) exceeds the maximum operating temperature, the component may have reduced performance or fail. Components such as processors may be thermally coupled to fin stacks 214 that have a surface area configured for improved heat transfer to air. For example, as depicted in FIG. 2, evacuative fans 172a may be located proximate to fin stacks 214a and oriented for directing airflow across fin stacks 214a to openings 218a and 218d.

In addition to the heat generated by individual components of portable information handling system 100, the compact design of chassis 200 and the configuration of portable information handling system 100 within chassis 200 may cause heat to build up in chassis 200. Ideally, heat exits chassis 200 via openings 218 in back panel 202 or openings 216 in side panels 206. However, as more components are contained in chassis 200, airflow may be more restricted, causing heat to be transferred to the environment through one or more of the bottom cover or top surface. If heat is transferred through the bottom cover and the surface temperature ($T_{SKIN}$) exceeds a maximum or limiting temperature, the heat could cause discomfort or injury to a user. Thus, the surface temperature $T_{SKIN}$ for a bottom cover of chassis 200 may be limited. A common limitation is for the surface temperature $T_{SKIN}$ for the bottom cover to not exceed 55 degrees Celsius (C).

In order to maintain an overall compact size of chassis 200 and maximize processing capabilities of components without allowing heat to build up, embodiments of a cooling system for chassis 200 containing portable information handling system 100 are disclosed. Referring to FIG. 3, embodiments of a cooling system for chassis 200 and portable information handling system 100 comprise thermal barrier 224 dividing chassis 200 into a plurality of zones, with a combination of evacuative fan(s) 172 to cool one or more components and hyperbaric fan 170 to cool chassis 200.

Chassis 200 may be divided into a plurality of zones (Zones 1, 2 and 3 are depicted in FIG. 3) by pressure barrier 224. The material used to form pressure barrier 224 and the layout of pressure barrier 224 in chassis 200 may depend on the size or dimensions of chassis 200 and the number, size, desired operating temperature, maximum operating temperature, or other characteristics of components in portable information handling system 100. In some embodiments, pressure barrier 224 comprises material to allow a pressure differential between two adjacent zones. In some embodiments, pressure barrier 224 may be formed with material to thermally isolate components, acoustically dampen noise in chassis 200, or provide electromagnetic insulation of one or more components in portable information handling system 100. In some embodiments, pressure barrier 224 formed with electromagnetic insulation forms a Faraday cage (not shown) around one or more components of portable information handling system 100.

FIG. 3 depicts Zones 1 and 3 with evacuative fans 172b located proximate to fin stacks 214b and oriented for directing airflow across fin stacks 214b to openings 218a and 218d. Notably, evacuative fans 172b and fin stacks 214b are smaller than evacuative fans 172a and fin stacks 214a, respectively, discussed in greater detail below.

Table 1 depicts representative measurements and simulated outcomes for comparing a first cooling system associated with chassis 200 having only evacuative fans 172a and a second cooling system associated with portable information handling system 100 utilizing pressure barrier 224 to divide chassis 200 into multiple zones and using evacuative fans 172b to cool components and one hyperbaric fan 170 to cool a bottom cover of chassis 200.

|  | Limit | Two fans | One hyperbaric fan and two evacuative fans plus thermal barrier | Difference |
|---|---|---|---|---|
| CPU + GPU Power | N/A | 85 W | 100 W | 15 W increase |
| CPU Power | N/A | 25 W | 35 W | 10 W increase |
| GPU Power | N/A | 60 W | 65 W | 5 W increase |
| Bottom cover temperature ($T_{SKIN}$) | 55 C. | 55 C. | 53 C. | 2 C. decrease |
| CPU $T_{JUNCTION}$ | 100 | 68 | 75 | 7 C. increase |
| GPU $T_{JUNCTION}$ | 89 | 77 | 86 | 9 C. increase |

As listed in Table 1, using two evacuative fans 172a to cool components, a CPU may operate at 25 W of power with a component operating temperature (CPU $T_{JUNCTION}$) at 68 C, which is below the maximum component operating temperature of 100 C and a GPU may operate at 60 W of power with a component operating temperature (GPU $T_{JUNCTION}$) at 77 C, which is below the maximum component operating temperature of 89 C. However, with the CPU and GPU both operating at their respective power levels, a bottom cover temperature ($T_{SKIN}$) reaches the maximum temperature of 55 C. Thus, the CPU and GPU cannot operate at higher processing powers because of the issues with cooling the bottom cover of chassis 200.

By comparison, using a cooling system associated with portable information handling system 100 the CPU may operate at 35 W of power with a component operating temperature (CPU $T_{JUNCTION}$) at 75 C and may the GPU may operate at 65 W of power with a component operating temperature (GPU $T_{JUNCTION}$) at 86 C, but the bottom cover temperature ($T_{SKIN}$) reaches only 53 C. Thus, the CPU power may be increased by 10 Watts and the GPU power may be increased by 5 W for a total 15 W increase without exceeding any maximum temperatures.

Embodiments of portable information handling system 100 utilize smart cooling strategies. As mentioned above, evacuative fans 172b and fin stacks 214b may be smaller than evacuative fans 172a and fin stacks 214a but are still able to cool components of portable information handling system 100. Furthermore, cooling system 190 cools components in portable information handling system 100 and cools a bottom cover of chassis 200. Table 2 depicts representative measurements and simulated outcomes comparing a first cooling system such as depicted in FIG. 2 and embodiments of cooling system 190 such as depicted in FIG. 3.

As listed in Table 2, comparing a cooling system associated with portable information handling system 100 with a cooling system using two larger evacuative fans 172a, the total foot print area may be 5% less and the fin stack size may be 11% less. Even though the component operating temperatures (CPU $T_{JUNCTION}$ and GPU $T_{JUNCTION}$) may be hotter, they are still below the maximum temperature and the surface temperature ($T_{SKIN}$) of the bottom cover may be reduced by 5 C.

As illustrated by Tables 1 and 2, portable information handling system 100 in chassis 200 may use cooling system 190 with an overall size that is smaller and generates less airflow but can cool components and a bottom cover of chassis 200 more effectively.

Referring now to FIGS. 4-7, computer simulated images of temperature and airflow profiles illustrate the effectiveness of cooling system 170 implemented in chassis 200.

Figure 4:
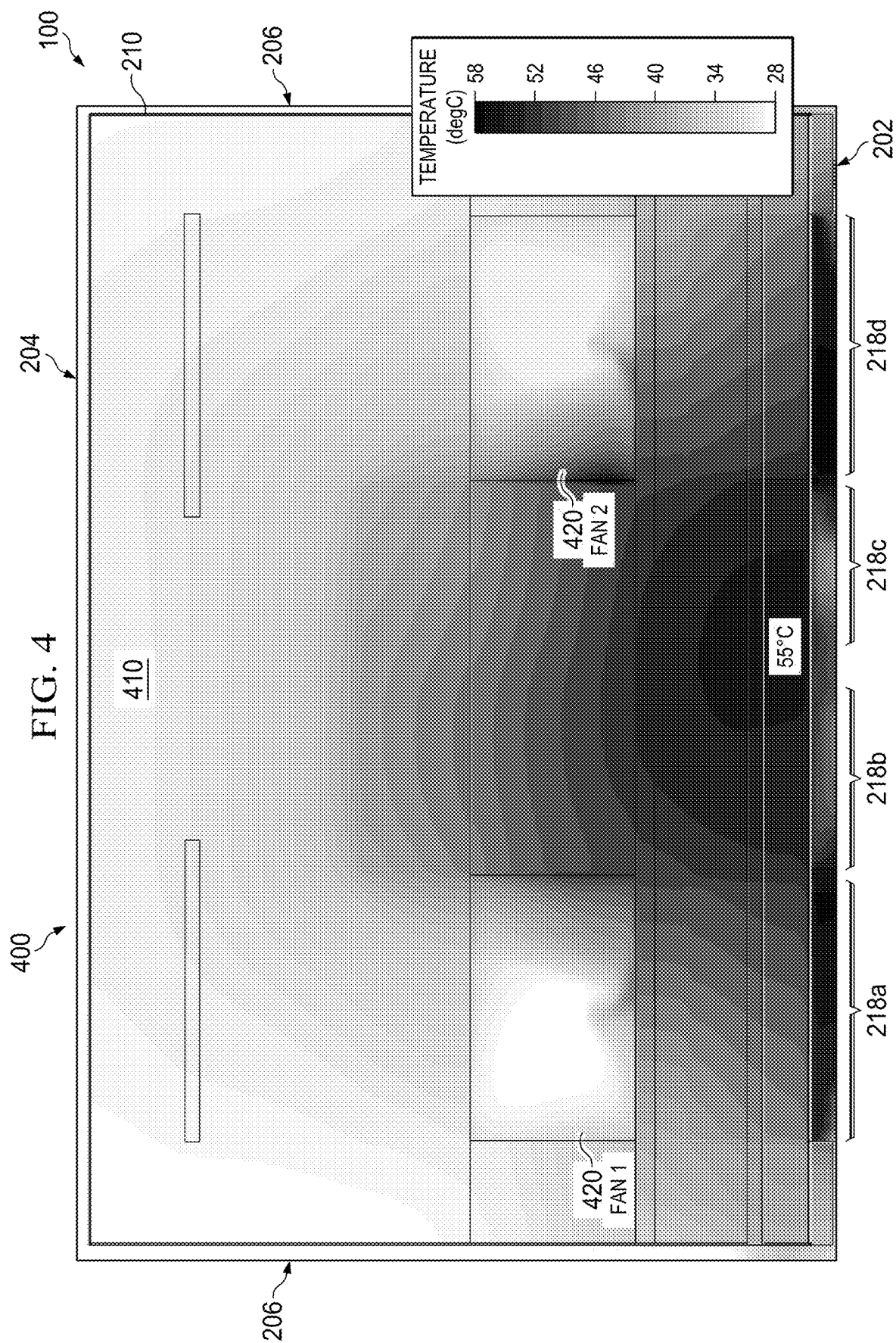
FIG. 4 is a computer simulated image of a temperature profile of a chassis with two evacuative fans.

FIG. 4 depicts a simulated image 400 of a temperature profile of bottom cover 410 for chassis 200 utilizing the cooling system depicted in FIG. 2. Simulated image 400 illustrates large areas 420 (associated with large evacuative fans 172a) with cooler temperatures, but bottom cover 410 reaches the maximum surface temperature ($T_{SKIN}$) of 55 C. Notably, even though openings 218a and 218d indicate significant heat being discharged from chassis 200 by evacuative fans 172a, openings 218b and 218c indicate little of the heat accumulated in chassis 200 is exiting.

Figure 5:
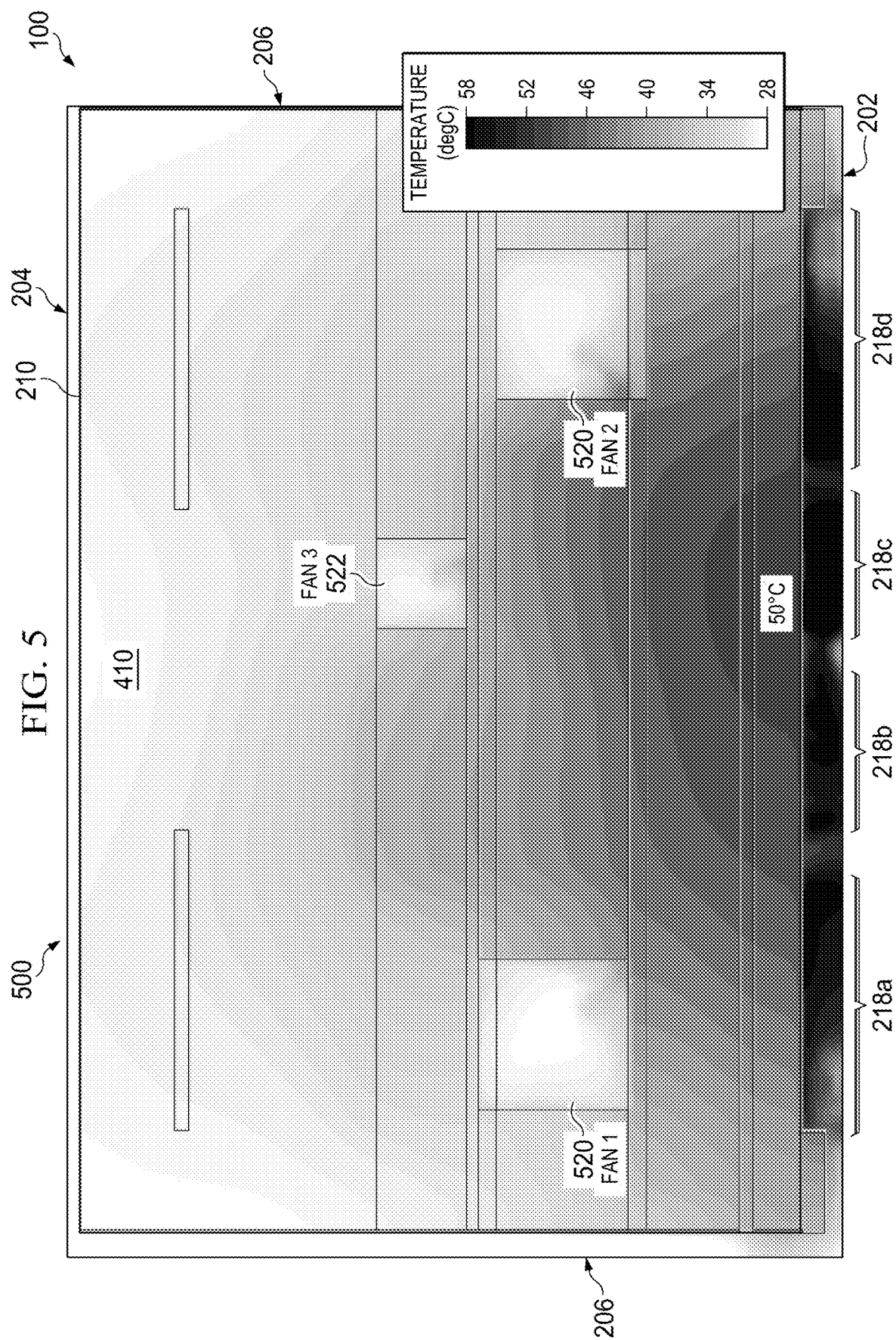
FIG. 5 is a computer simulated image of a temperature profile of a chassis with an embodiment of a cooling system utilizing a pressure barrier to divide the chassis into multiple zones, with an evacuative fan in each of two zones and a hyperbaric fan in a third zone.

FIG. 5 depicts a simulated image 500 of a temperature profile of bottom cover 410 for chassis 200 utilizing cooling system 190 depicted in FIG. 3. Simulated image 500 illustrates smaller areas 520 (associated with smaller evacuative fans 172b) with cooler temperatures and area 522 associated with hyperbaric fan 170. Using this combination of fans, along with pressure barrier 224 (not visible), bottom cover 410 reaches a surface temperature ($T_{SKIN}$) of 50 C. Notably, openings 218b and 218c indicate a larger transfer of heat from chassis 200 by hyperbaric fan 170 such that, even though openings 218a and 218d may be smaller than openings 218a and 218d in FIG. 4, significant heat is discharged from chassis 200 to cool bottom cover 410.

|  | Limit | System with two fans | System with pressure barrier, two evacuative fans and one hyperbaric fan | Difference |
|---|---|---|---|---|
| Total fan foot print area | N/A | 15488 mm$^2$ | 14668 mm$^2$ | 5% less |
| Fin stack size | N/A | 35 × 88 (each) | 35 × 78 (each) | 11% less |
| CPU Power | N/A | 25 W | 25 W | None |
| GPU Power | N/A | 60 W | 60 W | None |
| $T_{SKIN}$ | 55 C. | 55 C. | 50 C. | 5 C. cooler |
| CPU $T_{JUNCTION}$ | 100 | 68 | 69 | 1 C. hotter |
| GPU $T_{JUNCTION}$ | 89 | 77 | 79 | 2 C. hotter |

Figure 6:
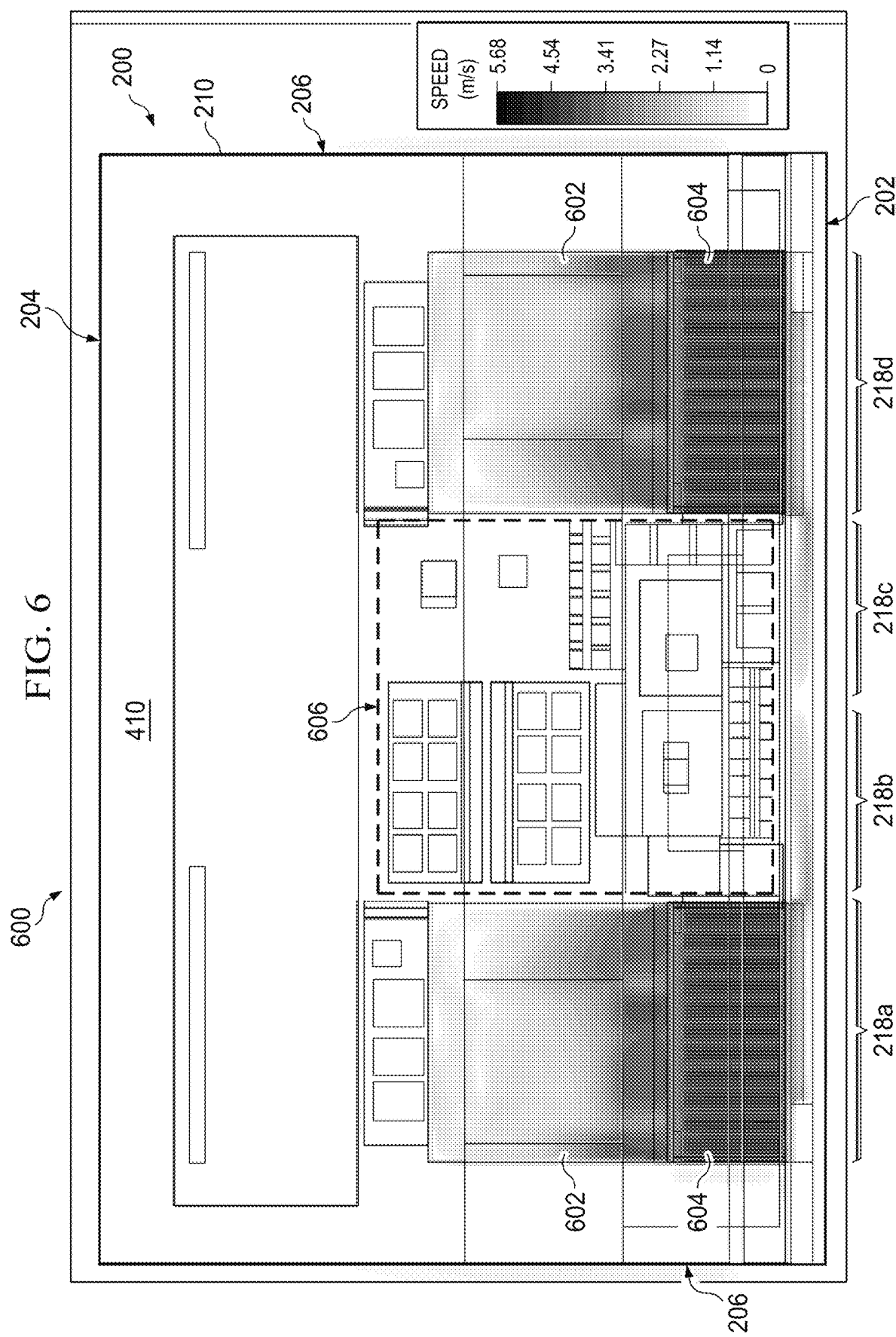
FIG. 6 is a diagram of an airflow profile of a chassis with two fans.

FIG. 6 depicts a simulated image 600 of an airflow profile for chassis 200 utilizing the cooling system depicted in FIG. 2. Simulated image 600 illustrates large areas 602 (associated with large evacuative fans 172a) with higher airflow speeds, but area 606 indicates little or no airflow speed. Notably, simulated image 600 depicts airflow speeds relative to openings 218b and 218c on back panel 202 as well as relative to side panels 206, indicating that heat in chassis 200 may circulate through chassis 200 before exiting.

Figure 7:
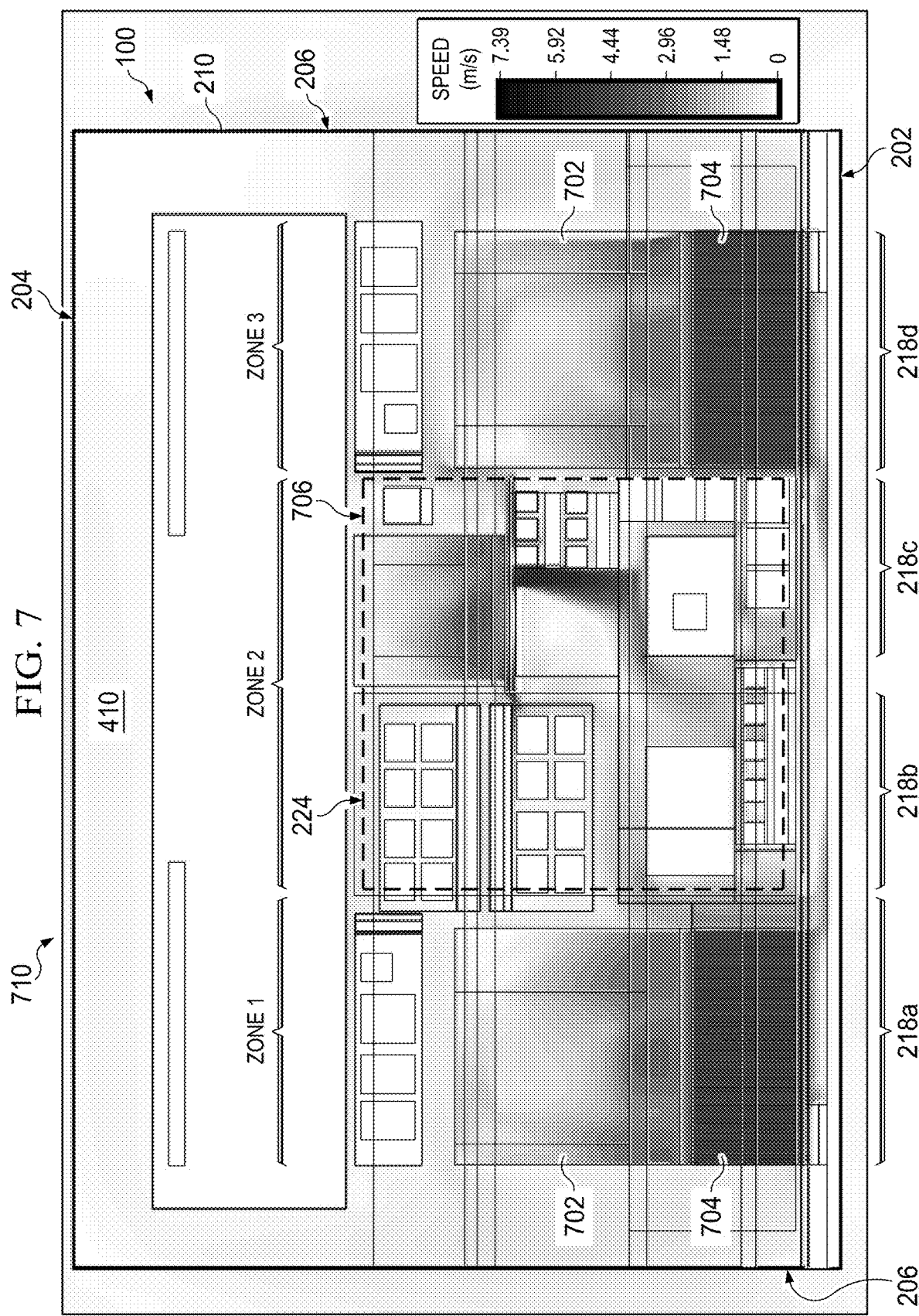
FIG. 7 is a computer simulated image of an airflow profile of a chassis with an embodiment of a cooling system utilizing a pressure barrier to divide the chassis into multiple zones, with an evacuative fan in each of two zones and a hyperbaric fan in a third zone.

FIG. 7 depicts a simulated image 700 of an airflow profile for chassis 200 utilizing cooling system 190 depicted in FIG. 3. Simulated image 700 illustrates smaller areas 702 (associated with Zones 1 and 3 having smaller evacuative fans 172b) with higher airflow speeds. Simulated image 700 further depicts area 706 (associated with Zone 2 having hyperbaric fan 170) with some airflow, indicating that a pressure barrier 224 isolating Zone 2 and an increase in pressure by hyperbaric fan 170 may provide enough airflow through chassis 200 to cool bottom cover 410. Notably, simulated image 600 depicts minimal airflow speeds relative to side panels 206, indicating that openings 216 or additional openings 218 may not be required to cool portable information handling system 100.

The systems and methods described herein may cool a portable information handling system by dividing the chassis into zones and positioning an evacuative fan in a first zone to cool components and positioning a hyperbaric fan in a second zone to increase air pressure to cool the chassis.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A cooling system for a chassis comprising a bottom cover, a back panel, two side panels and a front panel and an information handling system in the chassis, the cooling system comprising:
   a pressure barrier configured to divide the chassis into a plurality of zones;
   a first evacuative fan configured to generate a first airflow relative to one or more first components of the information handling system in a first zone of the plurality of zones to an opening in the first zone and to decrease air pressure in the first zone;
   a second evacuative fan configured to generate a second airflow relative to one or more second components of the information handling system in a second zone of the plurality of zones to an opening in the second zone to decrease air pressure in the second zone;
   a hyperbaric fan configured to generate a third airflow in a third zone of the plurality of zones to increase air pressure in the third zone to create a pressure differential between i) the first zone and the third zone and ii) the second zone and the third zone to cause air movement to one or more openings in the third zone, wherein the third zone is between the first zone and the second zone; and
   a controller configured to operate the first and the second evacuative fan to maintain an operating temperature of the one or more first and second components below a first temperature and operate the hyperbaric fan to maintain a temperature of the chassis below a second temperature.

2. The cooling system of claim 1, wherein:
   the pressure barrier is formed as a continuous barrier to isolate the one or more first components;
   the evacuative fan is located proximate to a fin stack thermally coupled with the one or more first components; and
   the first evacuative fan directs airflow across the fin stack and exits the chassis via the opening in the first zone.

3. The cooling system of claim 1, wherein the second temperature comprises a maximum surface temperature of the bottom cover.

4. The cooling system of claim 3, wherein the maximum surface temperature of the bottom cover is 55 C.

5. The cooling system of claim 1, wherein the pressure barrier comprises one or more of a thermal insulation material, an acoustic insulation material and an electromagnetic isolation material.

6. The cooling system of claim 5, wherein the pressure barrier forms a Faraday cage around the one or more components.

7. The cooling system of claim 1, wherein the hyperbaric fan comprises a dual opposed output fan with an intake on the bottom cover of the chassis.

8. An information handling system, comprising:
   a chassis defining an enclosure of the information handling system, the chassis having a bottom cover, a back panel, two side panels and a front panel;
   a pressure barrier for dividing the chassis into a plurality of zones;
   a first evacuative fan configured to generate a first airflow relative to one or more first components of the information handling system in a first zone of the plurality of zones to an opening in the first zone and to decrease air pressure in the first zone;
   a second evacuative fan configured to generate a second airflow relative to one or more second components of the information handling system in a second zone of the plurality of zones to an opening in the second zone to decrease air pressure in the second zone;
   a hyperbaric fan configured to generate a third airflow in a third zone of the plurality of zones to increase air pressure in the third zone to create a pressure differential between i) the first zone and the third zone and ii) the second zone and the third zone to cause air movement to one or more openings in the third zone, wherein the third zone is between the first zone and the second zone; and
   a controller configured to:
      operate the first and the second evacuative fan to maintain an operating temperature of the one or more first and second components below a first temperature; and
      operate the hyperbaric fan to maintain a temperature of the chassis below a second temperature.

9. The information handling system of claim 8, wherein:
   the pressure barrier is formed as a continuous barrier to isolate the one or more first components;
   the evacuative fan is located proximate to a fin stack thermally coupled with the one or more first components; and
   the evacuative fan directs airflow across the fin stack and exits the chassis via the opening in the first zone.

10. The information handling system of claim 8, wherein the second temperature comprises a maximum surface temperature of the bottom cover.

11. The information handling system of claim 10, wherein the maximum surface temperature of the bottom cover is 55 C.

12. The information handling system of claim 8, wherein the pressure barrier comprises one or more of a thermal insulation material, an acoustic insulation material and an electromagnetic isolation material.

13. The information handling system of claim 12, wherein the pressure barrier forms a Faraday cage around the one or more components.

14. The information handling system of claim 8, wherein the hyperbaric fan comprises a dual opposed output fan with an intake on the bottom cover of the chassis.

15. A method of cooling an information handling system in a chassis, the chassis having a bottom cover, a back panel, two side panels and a front panel, the method comprising:
- forming a pressure barrier in the chassis to divide the chassis into a plurality of zones;
- positioning a first evacuative fan in a first zone of the plurality of zones proximate to one or more first components of the information handling system such that the first evacuative fan is operable to generate an airflow relative to the one or more first components of the information handling system in the first zone to an opening in the first zone and decrease air pressure in the first zone;
- positioning a second evacuative fan in a second zone of the plurality of zones proximate to one or more second components of the information handling system such that the second evacuative fan is operable to generate an airflow relative to the one or more second components of the information handling system in the second zone to an opening in the second zone and decrease air pressure in the second zone;
- positioning a hyperbaric fan in a third zone such that the hyperbaric fan is operable to generate a third airflow in a third zone of the plurality of zones to increase air pressure in the third zone to create a pressure differential between i) the first zone and the third zone and ii) the second zone and the third zone to cause air movement to one or more openings in the third zone, wherein the third zone is between the first zone and the second zone;
- executing, by a controller communicatively coupled to the evacuative fan and the hyperbaric fan, a set of instructions for:
  - operating the first and the second evacuative fan to cool the one or more first and second components below a first temperature; and
  - operating the hyperbaric fan to cool the chassis below a second temperature.

16. The method of claim 15, wherein the second temperature comprises a maximum surface temperature of the bottom cover.

17. The method of claim 16, wherein the maximum surface temperature of the bottom cover is 55 C.

18. The method of claim 15, wherein the controller is configured to operate each of the first and the second evacuative fan and the hyperbaric fan independently.

* * * * *